(12) United States Patent
Mills et al.

(10) Patent No.: US 6,349,042 B1
(45) Date of Patent: Feb. 19, 2002

(54) APPARATUS FOR SHIELDING ELECTROMAGNETIC EMISSIONS

(75) Inventors: Richard S. Mills, Austin; Andrew L. McAnally, Georgetown, both of TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/534,177

(22) Filed: Mar. 24, 2000

(51) Int. Cl.$^7$ ................................................. H05K 7/20
(52) U.S. Cl. ........................ 361/818; 361/687; 361/695; 361/736; 174/35 R; 165/121
(58) Field of Search ................................. 361/220, 730, 361/736, 741, 752, 753, 756, 757, 796, 797, 798, 799, 800–802, 807–809, 816, 818, 687–695; 174/35 R, 35 GC, 35 C, 35 D, 52.1, 35 TC; 211/41; 439/92, 95, 552; 29/747, 831; 267/158, 160

(56) References Cited

U.S. PATENT DOCUMENTS

| | | | |
|---|---|---|---|
| 4,115,655 A | | 9/1978 | Prentice |
| 4,745,524 A | | 5/1988 | Patton, III |
| 4,780,570 A | | 10/1988 | Chuck |
| 4,873,394 A | * | 10/1989 | Bhagrava et al. .......... 174/35 R |
| 4,873,395 A | * | 10/1989 | Mast ..................... 174/35 GC |
| 5,204,496 A | * | 4/1993 | Boulay et al. .......... 174/35 GC |
| 5,308,251 A | | 5/1994 | Kaufman et al. |
| 5,490,043 A | | 2/1996 | Tan et al. |
| 5,502,620 A | | 3/1996 | Funck et al. |
| 5,532,428 A | | 7/1996 | Radloff et al. |
| 5,563,450 A | | 10/1996 | Bader et al. |
| 5,647,748 A | | 7/1997 | Mills et al. |
| 5,650,922 A | * | 7/1997 | Ho .............................. 361/799 |
| 5,653,596 A | | 8/1997 | Banakis et al. |
| 5,679,923 A | * | 10/1997 | Le ............................ 174/35 R |
| 5,686,695 A | * | 11/1997 | Chan ..................... 174/35 GC |
| 5,774,330 A | | 6/1998 | Melton et al. |
| 5,838,550 A | * | 11/1998 | Morris et al. ................ 361/818 |
| 5,856,632 A | * | 1/1999 | Bostrom et al. ........ 174/35 GC |
| 5,975,953 A | * | 11/1999 | Peterson ..................... 439/607 |
| 6,008,994 A | | 12/1999 | Bates |
| 6,018,464 A | * | 1/2000 | Kim ........................... 361/818 |
| 6,058,025 A | * | 5/2000 | Ecker et al. ................. 361/816 |
| 6,080,930 A | * | 6/2000 | Lommen et al. ........ 174/35 GC |

* cited by examiner

Primary Examiner—Leo P. Picard
Assistant Examiner—Michael Datskovsky
(74) Attorney, Agent, or Firm—Haynes and Boone, LLP

(57) ABSTRACT

An apparatus for mounting a system component in a chassis includes an electrically conductive chassis having a grounding frame mounted therein and electrically connected thereto. An access opening extends through the grounding frame. The access opening is defined by opposed longitudinal edges. An elongated contact member is attached to the grounding frame adjacent to each longitudinal edge of the access opening. Each one of the contact members is resiliently deflectable about a pivot axis adjacent the corresponding longitudinal edge. Discontinuities and obstructions along the edge portions of the expansion device do not engage and damage the contact members. Furthermore, a substantially continuous EMI gasket is provided along substantially the entire edge of the expansion card, improving the reliability of the ground between the chassis and the expansion device and reducing electromagnetic emissions.

20 Claims, 4 Drawing Sheets

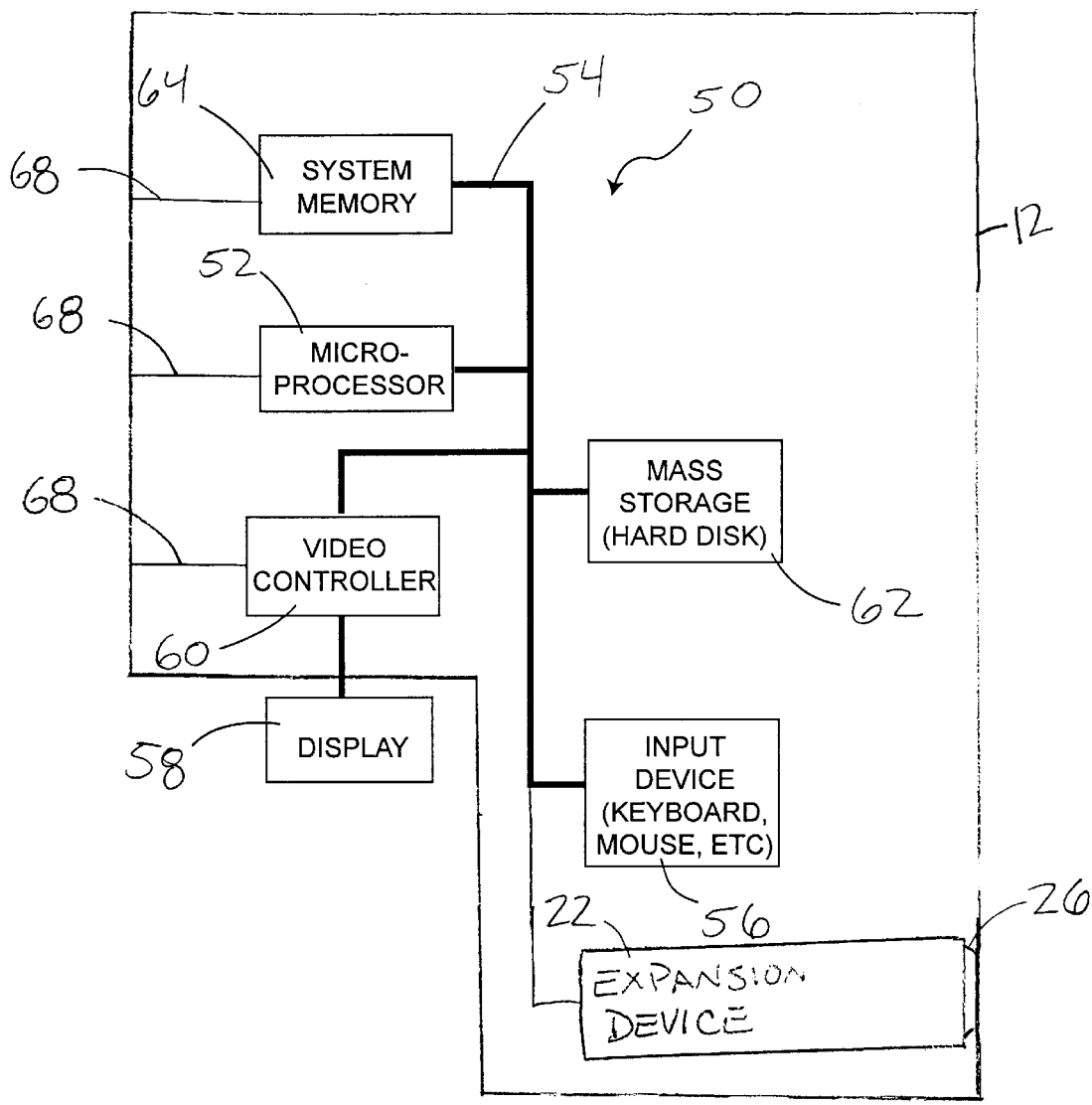

APPARATUS FOR SHIELDING ELECTROMAGNETIC EMISSIONS

BACKGROUND

The disclosures herein relate generally to computer systems and more particularly to a shielding apparatus for reducing electromagnetic emissions from a computer system.

In order to meet electromagnetic emissions regulations required by agencies such as the Federal Communication Commission (FCC), it is common practice to place a compliant and conductive grounding member between an expansion device of a computer and the computer chassis. The grounding member provides a ground path between the chassis and the card to aid in containing electromagnetic emissions within the chassis.

U.S. Pat. No. 5,653,396 discloses a grounding system for an electrical connector assembly which provides an interconnection between a PC card and a main printed circuit board. A header connector is mounted on the main printed circuit board and receives the PC card. Mating terminals are provided on the header connector and a receptacle connector on the PC card for interconnection of the PC card to electrical circuit traces on the main printed circuit board. At least one header grounding contact is mounted on the header connector adjacent, but spaced from, the terminals and is coupled to a logic ground circuit on the main printed circuit board. A card grounding contact is mounted on the PC card near the front insertion end thereof for engaging the header grounding contact and connecting the logic ground circuit of the main printed circuit board to a logic ground circuit on the PC card to provide a low impedance ground return.

U.S. Pat. No. 5,563,450 discloses a peripheral card including a two-part metal cover mounting a printed wiring board on a U-shaped plastic frame. The wiring board is spaced from inside surfaces of the cover preferably by a pair spring clips mountable on side edges of the wiring board, each clip having an apertured intermediate bight portion overlying, and in scraped contact with, ground contact pads on the board. Barbed-end spring fingers extend integrally from the bight portion preferably toward the board side edge to which it is affixed and into scraped contact with respective ones of the metal cover parts as the metal cover parts are assembled together. The clips hold the board from movement in the cover and electrically ground any static electrical charges on the metal cover parts to the contact pads and to a ground socket in the frame. The clips electrically ground the metal cover parts to provide electromagnetic shielding of the electrical circuitry on the wiring board.

U.S. Pat. No. 4,780,570 discloses an electromagnetic interference (EMI) shield for situations which require heavy-duty wiping insertions, such as occurring when a relatively heavy electronic assembly is to be removably inserted in a cabinet. In accordance with the invention, inexpensive integral EMI strips of conductive spring material are riveted to opposite cabinet walls so as to be adjacent the wiping sides of the inserted electronic assembly. Each EMI strip contains integral longitudinally spaced projecting fingers formed to provide durable and highly reliable EMI shielding capable of withstanding many insertions and removals.

A common commercially-implemented grounding member for use with expansion devices in a computer includes a metal shield with a series of compliant spring members. The spring members extend from a surface of the grounding member. The grounding member is positioned between the expansion device and the chassis. The ground path is created by the compliant spring members engaging against the expansion device and the shielding member being engaged against, or being attached to, the chassis.

Grounding members of this type are known to have a number of undesirable characteristics. First, these types of grounding members are easily damaged as a result of one or more of the spring members getting caught in the expansion cards during either removal or insertion of the expansion cards into the chassis. The spring members unintentionally entangle with notches in the expansion device. This results in the spring members being distorted, broken or otherwise disabled. Second, to ensure sufficient grounding performance and reliability, it is common for the grounding member to include a plurality of spring members. This increases the likelihood of one or more of the spring members being damaged. The use of a plurality of spring members significantly increases the forces associated with deflecting the spring members. With sufficient force, the grounding member can be distorted. The distortion may result in the grounding member interfering with cables being connected to the expansion cards in configurations where a cable connector is connected to the expansion device through an access opening extending through the grounding member.

Therefore, what is needed is a robust EMI shielding apparatus for use with a removable expansion device in an electronic device to reduce the potential for electromagnetic emissions from a chassis of the electronic device.

SUMMARY

Accordingly, in one embodiment, a reliable, damage resistant electromagnetic shielding apparatus uses elongated grounding members that extend in a direction generally parallel to the direction of insertion and extraction of a corresponding expansion device. To this end, an apparatus for mounting a system component in a chassis includes an electrically conductive chassis having a grounding frame mounted therein. The grounding frame has an access opening formed therein which is defined by opposed edges thereof. A contact member is attached adjacent to each edge whereby each access opening includes opposed contact members. Each contact member is resiliently deflectable.

A principal advantage of this embodiment is that discontinuities and obstructions along the edge portions of an expansion device do not engage and damage the contact members.

BRIEF DESCRIPTION OF THE DRAWING FIGURES

FIG. 5 is a block diagram illustrating an embodiment of a computer system according to the present invention.

DETAILED DESCRIPTION

Figure 1:
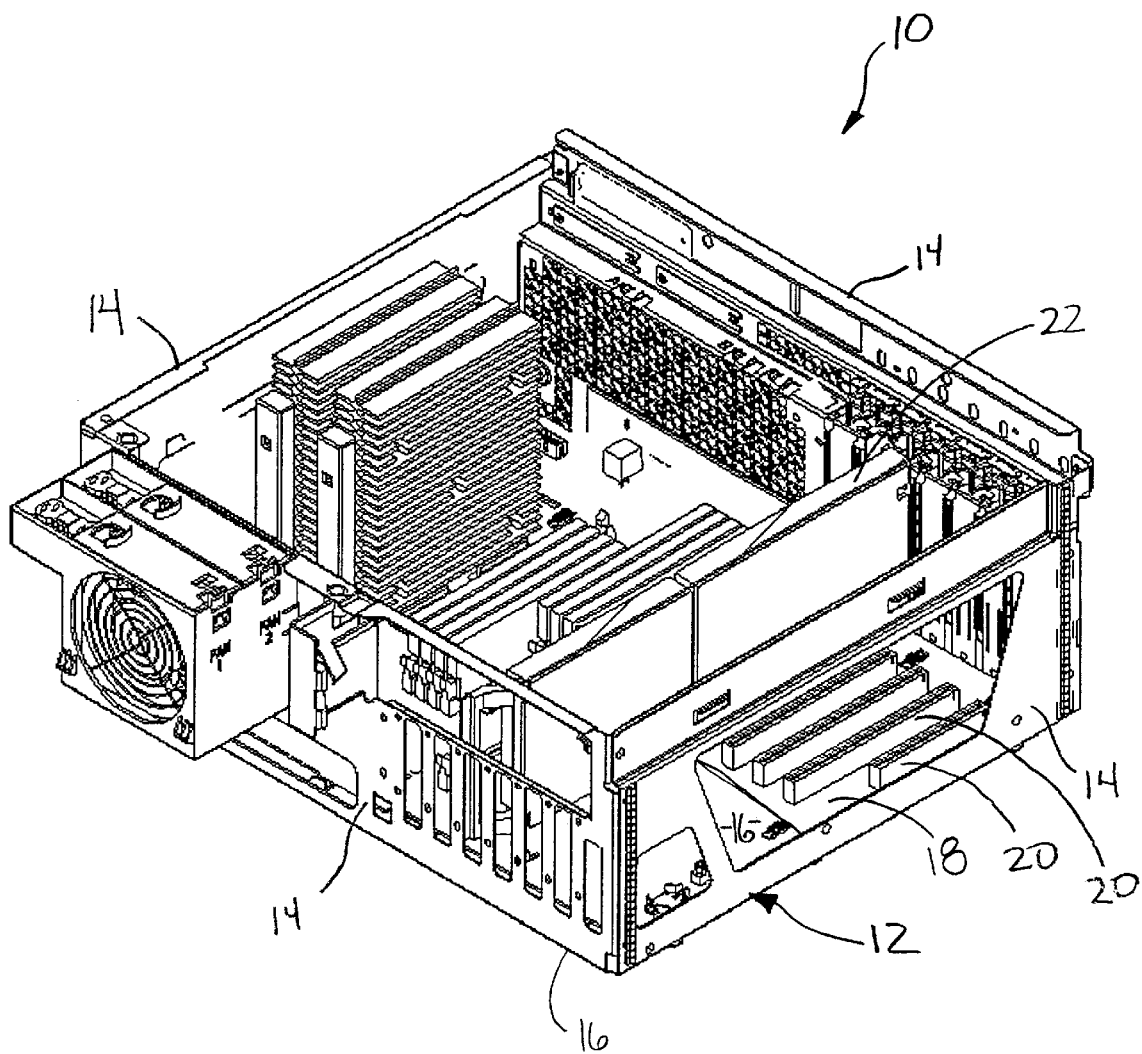
FIG. 1 is a perspective view illustrating an embodiment of an electronic device.
Figure 2:
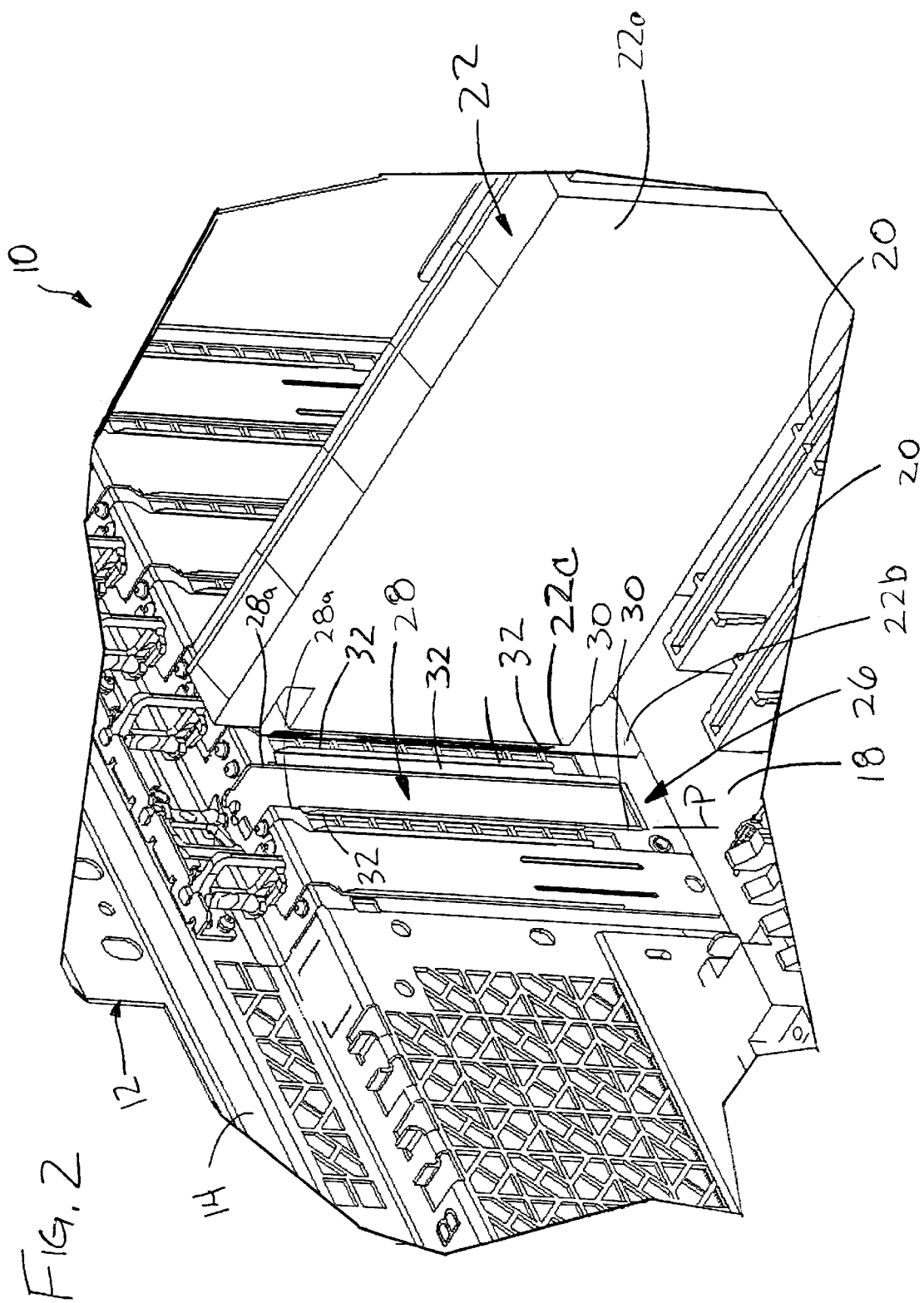
FIG. 2 is a fragmentary perspective view illustrating an expansion device mounting portion of the electronic device of FIG. 1.

An embodiment of an electronic device 10 is illustrated in FIGS. 1 and 2. A computer illustrates one example of the electronic device 10. The electronic device 10 includes a chassis 12 having a plurality of walls 14 and a base 16. The walls 14 extend in a direction generally perpendicular to the base 16.

A printed circuit substrate 18, such as a motherboard, is mounted on the base 16 of the chassis 12. A plurality of connectors 20 are mounted on, and electrically connected to, the printed circuit substrate 18. An expansion device 22 is mounted on and electrically connected to one of the connectors 20, FIG. 1. More than one expansion device 22 may be mounted in the chassis 12. The expansion device 22 includes a conductive enclosure 22a having an end plate 22b, FIG. 2, attached to an end portion 22c thereof. The expansion device 22 is mounted in the chassis 12 with the end plate 22b positioned adjacent to one of the walls 14 of the chassis 12.

A grounding frame 26, FIG. 2, is positioned between the chassis 12 and the end plate 22b of the expansion device 22 for providing a reliable ground path between the chassis 12 and the expansion device 22. A plurality of access openings 28 extend through the ground frame 26. Each access opening 28 is defined by opposing longitudinal edges 28a.

In most embodiments of a chassis, each access openings 28 in the ground frame 26 will be aligned with a mating access opening extending through the corresponding wall 14 of the chassis 12. Each access opening 28 and mating access opening in the chassis 12 provides access to the end portion 22c of the expansion device 22 for manipulating controls of the expansion device 22, attaching cables to the expansion device 22, or otherwise interacting with the expansion device 22 when it is mounted in the chassis 12.

Figure 3:
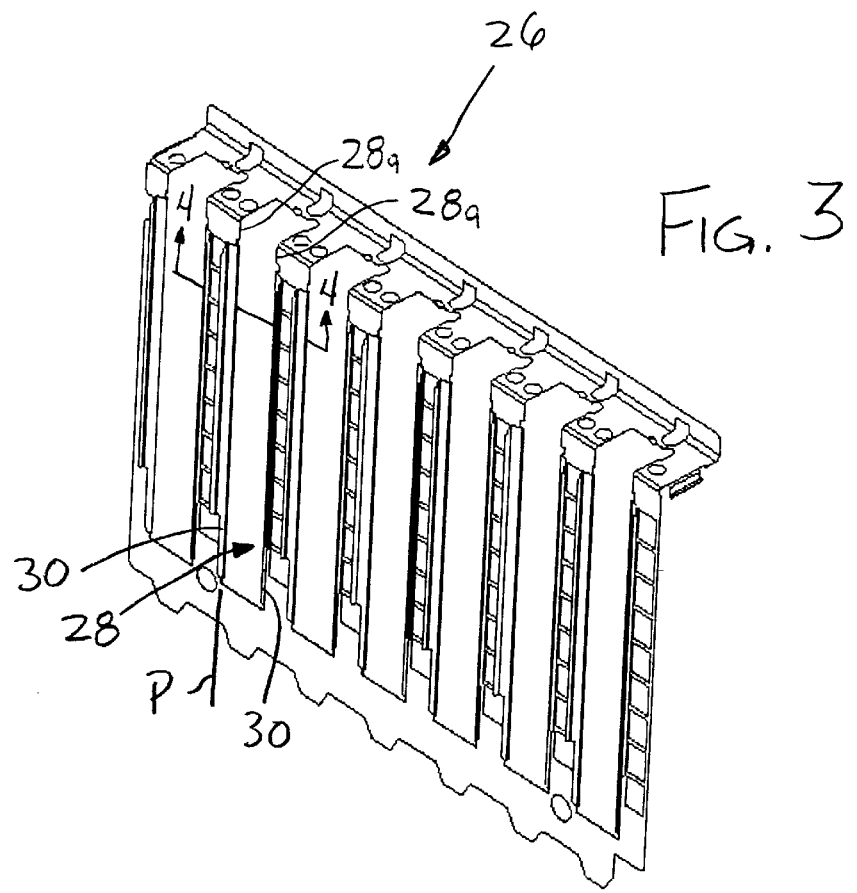
FIG. 3 is a perspective view illustrating an embodiment of an EMI shielding gasket.
Figure 4:
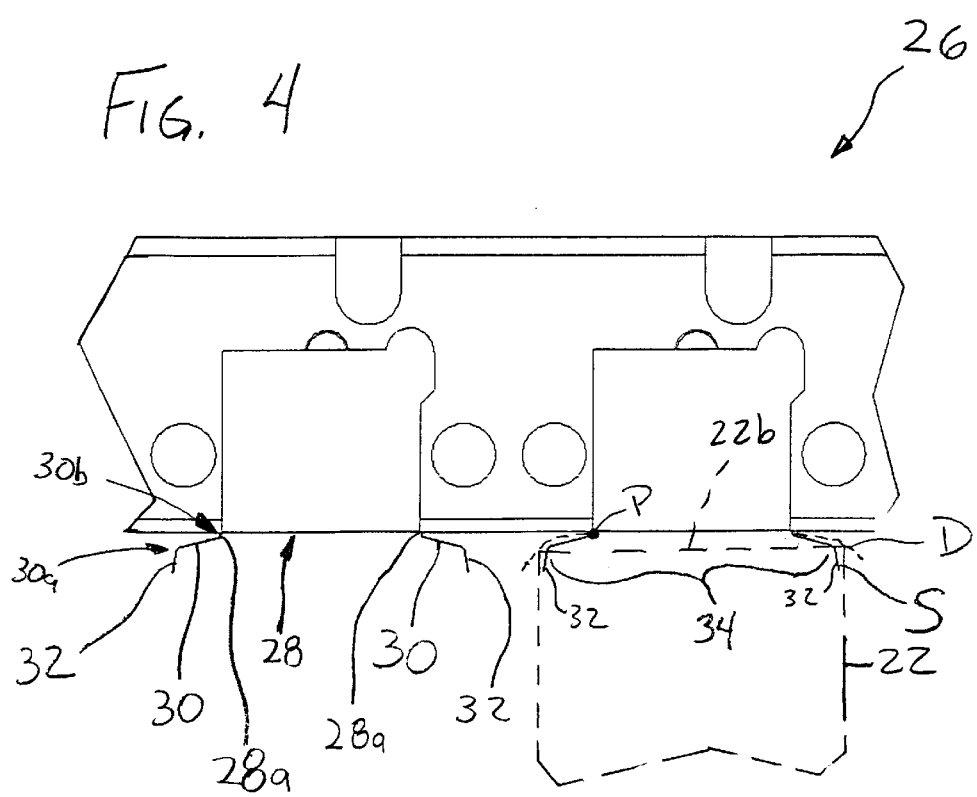
FIG. 4 is a cross sectional view taken along the line 4—4 in FIG. 3.

Referring now to FIGS. 2–4, an elongated contact member 30 is attached to the grounding frame 26 adjacent to each longitudinal edge 28a of each access opening 28. Each contact member 30 preferably has a length substantially the same as a length of the corresponding longitudinal edge 28a. Each contact members 30 is resiliently deflectable about a respective pivot axis P, FIG. 3, defined by the corresponding longitudinal edge 28a. Upon attachment of the expansion device 22 to the connector 20, the end plate 22b engages the contact members 30, deflecting the contact members from a static position S to a deflected position D FIG. 4. Variables such as the length of the expansion device 22 and the position of the connector 20 relative to the end wall 14 that supports the grounding frame 26 dictate the degree to which the contact members 30 are deflected.

An elongated flange member 32, FIGS. 3 and 4, is attached to each contact member 30. A first edge portion 30a, FIG. 4, of each contact member 30 is attached to a corresponding edge portion of the respective flange member 32. A second edge portion 30b, FIG. 4, of each contact member 30 is attached to the corresponding longitudinal edge 28a of the corresponding access opening 28. Each flange member 32 is in angled relationship with respect to the corresponding contact member 30 such that a channel 34 is defined between the flange members 32 of each respective access opening 28.

Due to manufacturing tolerances and capabilities, there is typically a thin design gap, typically around 0.015" between the chassis 12 and the end plate 22b of the expansion device 22. The grounding frame 26 is made of a thin material and is designed to fit into this gap. The contact members 30 act as resilient shields that provide a contact interface between the chassis 12 and expansion device 22, establishing a reliable ground path therebetween. When an expansion device 22 is mounted in the chassis 12, the conductive members 30 and flange members 32 of the access opening 28 act as EMI shielding members to reduce the potential for electromagnetic emissions to breach the chassis 12 through the corresponding access opening 28.

The grounding member 26 disclosed herein provides a reliable ground path between the chassis and the expansion devices, but is resistant to being damaged during installation or removal of a corresponding expansion device 22. Furthermore, the channel 34 defined by the flange members 32 serves to guide the expansion device 22 when it is being installed in or removed from the chassis 12.

The chassis 12 and the enclosure 22a of the expansion device are typically made of a conductive material such as sheet metal. The grounding frame 26 is typically made from commercially available conductive material such as a thin sheet of beryllium copper alloy, phosphor bronze alloy or tin plated steel. The contact members 30 may be integral with the grounding frame 26 and each flange member 32 may be integral with the corresponding contact member 30. The chassis 12 and the grounding frame 26 may be made using conventional manufacturing processes such as sheet metal forming techniques and progressive die stamping, respectively.

An embodiment of a computer system 50 is illustrated in FIG. 5. The computer system 50 includes at least one microprocessor 52. The microprocessor 52 is connected to a bus 54. The bus 54 serves as a connection between the microprocessor 52 and other components of the computer system 50. An input device 56 is coupled to the microprocessor 52 to provide input to the microprocessor 52. Examples of input devices include keyboards, touchscreens, and pointing devices such as a mouse, a trackball and a trackpad. The computer system 50 may also include a display 58, which is coupled to the microprocessor 52 typically by a video controller 60. Programs and data are stored on a mass storage device 62 which is coupled to the microprocessor 52. Mass storage devices include components such as hard disks, optical disks, magneto-optical drives, floppy drives, and the like. A system memory 64 provides the microprocessor 52 with fast storage to facilitate execution of computer programs by the microprocessor 52. It should be understood that other busses and intermediate circuits can be employed between the components described above and microprocessor 52 to facilitate interconnection between the components and the microprocessor 52.

Still referring to FIG. 5, the expansion device 22 discussed above, is coupled to the microprocessor 52 through the bus 54. Various components of the computer system, including the expansion device 22, are mounted in an enclosure such as chassis 12. The expansion device 22 is electrically coupled to the chassis 12 by the grounding frame 26. Other components such as the microprocessor 52, the system memory 64 and the video controller 60 may also be coupled to the chassis 12, either directly through a grounding member 68, through the bus 54, or both.

As a result, one embodiment of an apparatus for mounting a system component in a chassis includes an electrically conductive chassis having a grounding frame mounted therein. The grounding frame has an access opening formed therein which is defined by opposed edges thereof. A contact member is attached adjacent to each edge whereby each access opening includes opposed contact members. Each contact member is resiliently deflectable.

Another embodiment provides a computer system including an electrically conductive chassis having a microprocessor mounted therein. A system memory is coupled to provide storage to facilitate execution of computer programs by the microprocessor. An input is coupled to provide input to the microprocessor and a display is coupled to the microprocessor by a video controller. A mass storage is coupled to the microprocessor. A grounding frame is mounted within and electrically connected to the chassis. The grounding frame includes an access opening extending therethrough. The access opening defines opposed longitudinal edges thereof. An elongated contact member is attached to the grounding frame adjacent to each longitudinal edge of the corresponding access opening. Each one of the contact members is resiliently deflectable about a pivot axis defined by the corresponding longitudinal edge.

A further embodiment provides an EMI shielding device including a grounding frame having a plurality of access openings extending therethrough. Each access opening defines opposed longitudinal edges thereof. An elongated contact member is attached to each one of the longitudinal edges of the corresponding access opening. Each one of the contact members is resiliently deflectable about a respective pivot axis defined by the corresponding longitudinal edge of the respective access opening and has a length substantially the same as a length of the corresponding longitudinal edge. An elongated flange member is attached to each contact member. A first edge portion of each contact member is attached to a corresponding edge portion of the respective flange member and a second edge portion of each contact member is attached to the corresponding longitudinal edge of the respective access opening.

As it can be seen, the embodiments presented herein provide several advantages. Discontinuities and obstructions along the edge portions of the expansion device do not engage and damage the contact members during insertion and removal of the expansion device. The grounding member provides a substantially continuous EMI gasket along substantially the entire edge of the expansion card, improving the reliability of the ground between the chassis and the expansion device, reducing electromagnetic emissions. The contact members and flanges function in a funnel-like manner to guide the expansion device into a corresponding chassis opening. The funneling action acts to align the expansion device to the chassis slot and connector on the motherboard during the assembly process, reducing misalignment between the expansion card and the corresponding connector.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for mounting a system component in a chassis comprising:
    an electrically conductive chassis;
    a grounding frame mounted in the chassis, the grounding frame having an access opening formed therein, the access opening being defined by opposed edges;
    a contact member attached adjacent each edge whereby each access opening includes opposed contact members;
    each contact member being resiliently deflectable; and
    a flange member attached to each contact member whereby each access opening includes opposed flange members defining a channel therebetween.

2. The apparatus as defined in claim 1 wherein each edge member is elongated and each adjacent contact member is elongated.

3. The apparatus as defined in claim 2 wherein each edge member and each contact member are of substantially the same length.

4. The apparatus of claim 1 wherein each flange member is angled with respect to a corresponding one of the contact members.

5. The apparatus of claim 1, further comprising:
    an expansion device mounted in the chassis, the expansion device including an end plate engaged with the contact members.

6. The apparatus of claim 5 wherein the expansion device is mounted on the chassis in a position such that the contact members are deflected by the end plate from a static position to a displaced position.

7. The apparatus of claim 5 wherein the end plate engages the channel.

8. The apparatus of claim 3 wherein the contact members are deflectable about a pivot axis coincident with a respective edge of the access opening.

9. The apparatus of claim 7 wherein the grounding frame, the contact members and the flange members are integrally formed.

10. A computer system, comprising:
    an electrically conductive chassis;
    a microprocessor mounted in the chassis;
    a system memory coupled to provide storage to facilitate execution of computer programs by the microprocessor;
    an input coupled to provide input to the microprocessor;
    a video controller coupled to the microprocessor;
    a mass storage coupled to the microprocessor;
    a grounding frame mounted within and electrically connected to the chassis, the grounding frame including an access opening extending therethrough, the access opening defining opposed longitudinal edges thereof;
    an elongated contact member attached to the grounding frame adjacent to each longitudinal edge of the access opening, each one of the contact members being resiliently deflectable about a pivot axis defined by the corresponding longitudinal edge; and
    an elongated flange member attached to each contact member.

11. The computer system of claim 10 further comprising:
    an expansion device mounted in the chassis and electrically connected to the microprocessor, the expansion device including an elongated end plate engaged with the contact members.

12. The computer system of claim 11 wherein the expansion device is mounted on the chassis in a position such that the contact members are deflected by the end plate from a static position to a displaced position.

13. The computer system of claim 10 wherein each contact member and each corresponding longitudinal edge are of substantially the same length.

14. The computer system of claim 10 wherein a first edge portion of each contact member is attached to a corresponding edge portion of the respective flange member, and wherein a second edge portion of each contact member is attached to the corresponding longitudinal edge of the access opening.

15. The computer system of claim 14 wherein the flange member is in angled relationship with respect to the contact member such that the flange members define a channel extending therebetween, the first and the second edge portions of the contact members extending generally parallel to the longitudinal edges of the corresponding access opening.

16. The computer system of claim 10, further comprising:

a printed circuit substrate mounted on the chassis adjacent to the grounding frame, the contact members of the grounding frame extending generally perpendicular to a mounting surface of the printed circuit substrate.

17. The computer system of claim 10 wherein the contact members are integral with the grounding frame.

18. The computer system of claim 17 wherein each flange member is integral with the corresponding contact member.

19. The computer system of claim 10 wherein the flange member is integral with the contact member.

20. An EMI shielding device, comprising:

a grounding frame including a plurality of access openings extending therethrough, each access opening defining opposed longitudinal edges thereof;

an elongated contact member attached to each one of the longitudinal edges of the corresponding access opening, each one of the contact members being resiliently deflectable about a respective pivot axis defined by the corresponding longitudinal axis and having a length substantially the same as a length of the corresponding longitudinal edge; and an elongated flange member attached to each contact member, a first edge portion of each contact member being attached to a corresponding edge portion of the respective flange member and a second edge portion of each contact member being attached to the corresponding longitudinal edge of the respective access opening.

\* \* \* \* \*